United States Patent
Lou et al.

(10) Patent No.: US 8,310,264 B2
(45) Date of Patent: Nov. 13, 2012

(54) METHOD FOR CONFIGURING COMBINATIONAL SWITCHING MATRIX AND TESTING SYSTEM FOR SEMICONDUCTOR DEVICES USING THE SAME

(75) Inventors: Choon Leong Lou, Hsinchu (TW); Hsiao Hui Hsieh, Hsinchu (TW)

(73) Assignee: Star Technologies Inc., Hsinchu (TW)

( * ) Notice: Subject to any disclaimer, the term of this patent is extended or adjusted under 35 U.S.C. 154(b) by 475 days.

(21) Appl. No.: 12/540,654

(22) Filed: Aug. 13, 2009

(65) Prior Publication Data

US 2010/0231254 A1    Sep. 16, 2010

(30) Foreign Application Priority Data

Mar. 11, 2009   (TW) ............................... 98107829 A

(51) Int. Cl.
   *G01R 31/26*   (2006.01)

(52) U.S. Cl. .............................. 324/762.01; 324/762.02

(58) Field of Classification Search .. 324/762.01–762.1, 324/754.01–754.3, 750.01–750.3; 257/48; 365/189.04, 230.09

See application file for complete search history.

(56) References Cited

U.S. PATENT DOCUMENTS

| | | | | |
|---|---|---|---|---|
| 4,746,855 A | * | 5/1988 | Wrinn | ...................... 324/763.01 |
| 5,124,638 A | | 6/1992 | Winroth | |
| 5,559,482 A | | 9/1996 | Close et al. | |
| 6,069,484 A | | 5/2000 | Sobolewski et al. | |
| 6,100,815 A | | 8/2000 | Pailthorp | |
| 6,791,344 B2 | | 9/2004 | Cook et al. | |
| 7,863,888 B2 | * | 1/2011 | Xu | .............. 324/750.3 |
| 7,924,035 B2 | * | 4/2011 | Huebner | .................. 324/754.01 |

FOREIGN PATENT DOCUMENTS

| | | |
|---|---|---|
| JP | U1989-59332 | 4/1989 |
| JP | 2005-323297 | 11/2005 |

OTHER PUBLICATIONS

Decision to Grant Patent Issued on Mar. 6, 2012 from Japan Counterpart Application No. 2009-205565.

* cited by examiner

*Primary Examiner* — Tung X Nguyen
(74) *Attorney, Agent, or Firm* — WPAT, P.C.; Anthony King

(57) ABSTRACT

A method for configuring a combinational switching matrix comprises the steps of setting a first switching module and a second switching module, coupling at least one of the output ports of the first switching module with at least one of the input ports of the second switching module to form the combinational switching matrix, building a connection mapping table based on the coupling relationship between the output port of the first switching module and the input port of the second switching module, and displaying a channel switching interface showing the input terminals, the output terminals, and the on/off states of the virtual switching devices of the combinational switching matrix.

22 Claims, 8 Drawing Sheets

METHOD FOR CONFIGURING COMBINATIONAL SWITCHING MATRIX AND TESTING SYSTEM FOR SEMICONDUCTOR DEVICES USING THE SAME

BACKGROUND OF THE INVENTION (A) Field of the Invention

The present invention relates to a method for configuring a combinational switching matrix and a testing system for semiconductor devices using the same, and more particularly, to a method for configuring a combinational switching matrix incorporating a plurality of switching modules, and a testing system for semiconductor devices using the same.

(B) Description of the Related Art

Generally, it is necessary to test the electrical characteristics of semiconductor device such as the integrated circuit devices at the wafer level to check whether the integrated circuit device meets the product specifications. Integrated circuit devices with electrical characteristics meeting the specifications are selected for the subsequent packaging process, while other devices are discarded to avoid additional packaging cost. Another electrical property test is performed on the integrated circuit device after the packaging process is completed, so as to screen out substandard devices and increase product quality.

Electronic instrumentations comprising of different types and quantity of measurement resources are used to test and analyze the performance of devices, and circuits on the wafer. A plurality of test leads from the measurement resources are connected to selected points, within the device or circuit on the wafer in order to perform the desired tests. Conventionally, a customized or generic switching matrix or multiplexer is used to easily change the connections between test instruments and multiple or single device under test (DUT). The switching matrix is configured to connect input ports to output ports in arbitrary combinations in accordance with an instruction from a user. At wafer-level, depending on the electric properties being measured, one or more test instruments are connected to the input ports, a probe card is connected to the output ports, and the target DUT is connected to the probe card. The input ports and the output ports are connected via relay switches that builds up the connection path within the matrix or multiplexer, and the electrical connections between the input ports and the output ports are opened or closed by the relay switches. The above description is also applicable to package-level test in which devices or circuits are tested with the use of sockets on printed circuit board that link it to the instruments directly or via a matrix and/or multiplexer. U.S. Pat. No. 6,069,484, U.S. Pat. No. 5,124,638, U.S. Pat. No. 5,559,482, U.S. Pat. No. 6,791,344, and U.S. Pat. No. 6,100,815 disclose the application of the switching matrix to the testing of the integrated circuit devices.

SUMMARY OF THE INVENTION

One aspect of the present invention provides a method for configuring a combinational switching matrix incorporating a plurality of switching modules and a testing system for semiconductor devices using the same, which helps users work efficiently and reduce testing costs.

A method for configuring a combinational switching matrix according to this aspect of the present invention includes a step of setting a first switching module and a second switching module such that the first switching module includes a plurality of first input ports, first output ports and first switching devices, and the second switching module includes a plurality of second input ports, second output ports and second switching devices, wherein the first switching devices are configured to open and close the electrical connection between the first input ports and the first output ports, and the second switching devices are configured to open and close the electrical connection between the second input ports and the second output ports. Subsequently, at least one of the first output ports is coupled with at least one of the second input ports to form the combinational switching matrix including a plurality of input terminals, output terminals and virtual switching interface representing the connection states between the input terminals and the output terminals. A connection mapping table is then built by considering the coupling relationship between the first output ports and the second input ports, wherein the connection mapping table records the relationship between the virtual switching devices, the first switching module and the second switching module. A channel switching interface is displayed to show the input terminals, the output terminals, and a plurality of objects representing the virtual switching devices. Such connections can be further extended to third, fourth or further extensions of switching modules.

Another aspect of the present invention provides a testing system for semiconductor devices comprising a combination switching matrix, a processor, and a controller. The combination switching matrix includes a first switching module and a second switching module, the first switching module includes a plurality of first input ports, first output ports and first switching devices, and the second switching module includes a plurality of second input ports, second output ports and second switching devices, wherein the first switching devices are configured to open and close the electrical connection between the first input ports and the first output ports, and the second switching devices are configured to open and close the electrical connection between the second input ports and the second output ports. In particular, at least one of the first output ports is coupled with at least one of the second input ports. The processor is configured to generate a changing instruction in response to an input instruction from a user, and the controller is configured to control the opening and closing of the first switching devices and the second switching devices in response to the changing instruction.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

The above invention allows the development of highly complex and customized switching matrices and multiplexer with simple modules. This allows standard switching modules to be used and subsequently configured to match any special requirements. In addition, extension of a simplified matrix with low quantity of input and output ports can be extended and upgraded in a later date to increase the input and output ports depending on the devices and circuit under tests.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
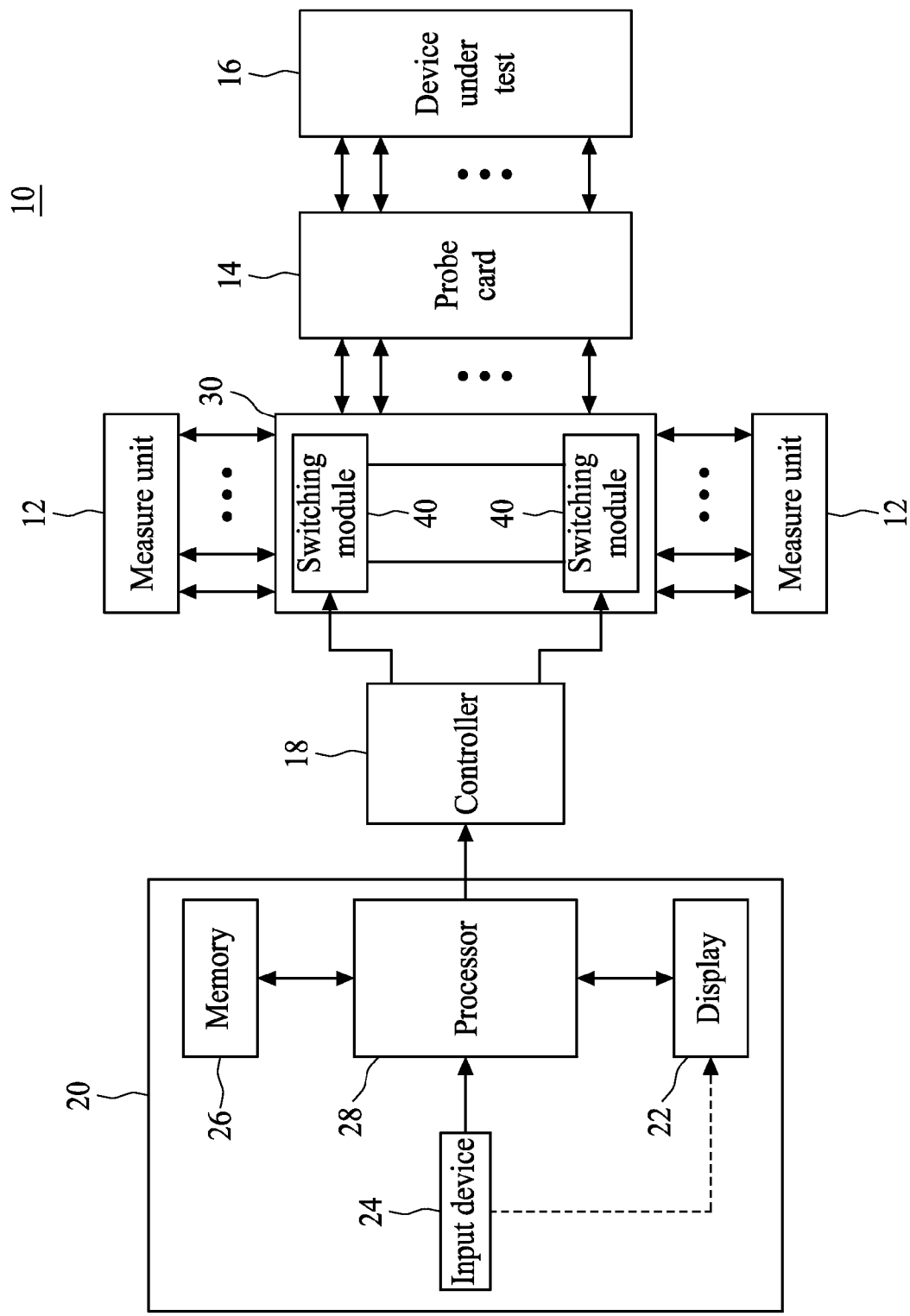
FIG. 1 illustrates a testing system for semiconductor devices according to one embodiment of the present invention.

FIG. 1 illustrates a testing system 10 for semiconductor devices according to one embodiment of the present invention. The testing system 10 comprises a plurality of measurement units 12, a combinational switching matrix 30, a probe card 14, a device under test 16 such as the integrated circuit device, a controller 18, and an operation system 20. The measurement instruments 12 may include a power supply and a sensor such as current and voltage sources, or digital signals to bias the device under tests and with current meter, voltmeter, oscilloscope, digitizer, etc. for measuring the electrical properties of the device under test 16. At wafer-level, the probe card 14 may include a plurality of probes configured to contact the pads of the device under test 16. The combinational switching matrix 30 includes a plurality of switching module 40, which can be the same or different types. The operation system 20 includes a display 22, an input device 24, a memory 26 and a processor 28, which is configured to control the operation of the display 22, the input device 24, the memory 26, and the controller 18.

Figure 2:
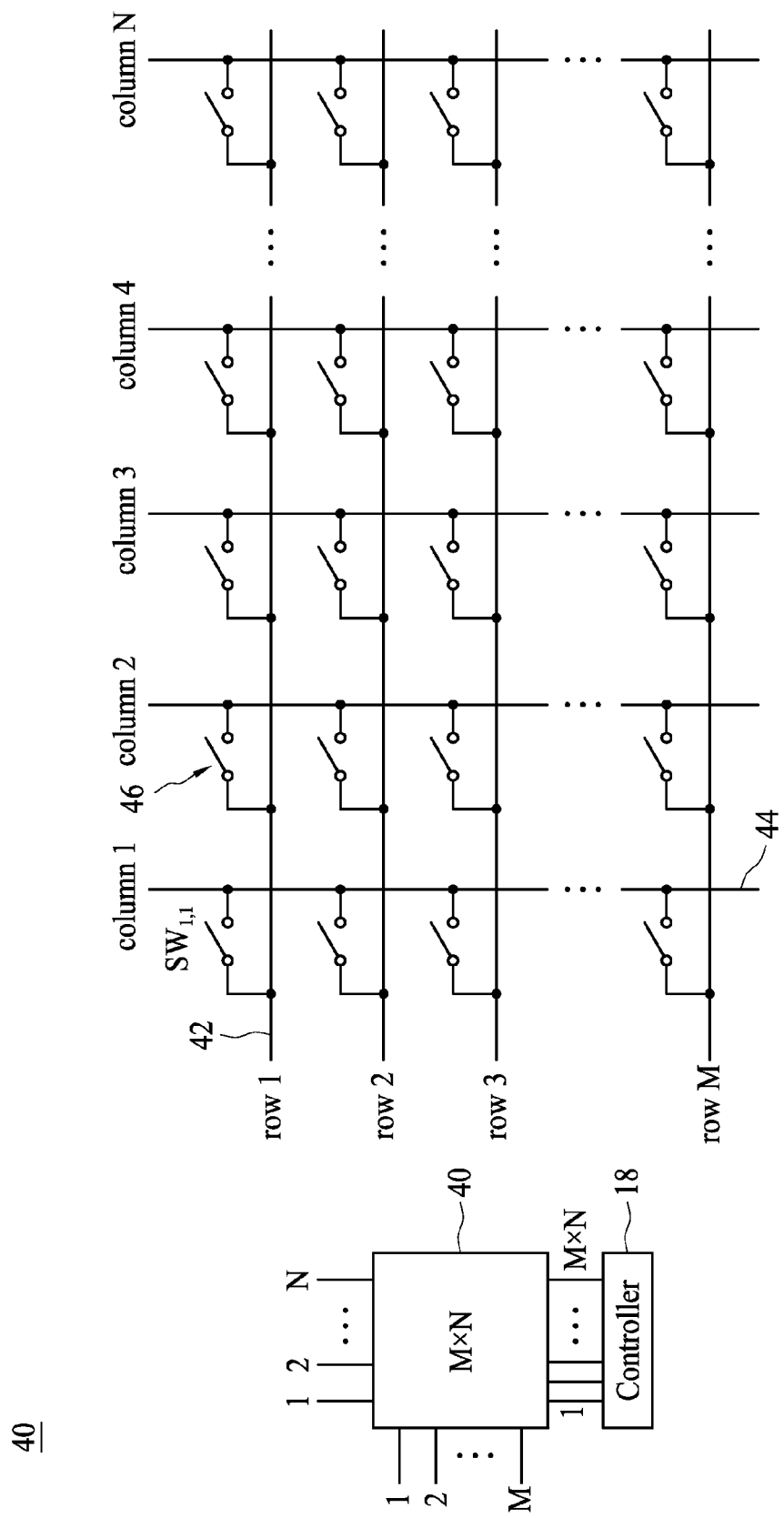
FIG. 2 illustrates the switching module in FIG. 1 according to one embodiment of the present invention.

FIG. 2 illustrates the switching module 40 in FIG. 1 according to one embodiment of the present invention. The switching module 40 includes N row ports and M column ports, and M and N are integers larger than 1. The row ports 1 to M are connected to corresponding row lines 42, and the column ports 1 to N are connected to corresponding column lines 44. The switching module 40 further includes a plurality of switching devices 46 ($SW_{i,j}$) arranged in an array manner, wherein each switching device $SW_{i,j}$ connects one row line 42 and one column line 44, and the first suffix indicates the connected row line and the second suffix indicates the connected column line. When the switching device $SW_{1,1}$ is in a closed state (turned on), the row port 1 is electrically connected to the column port 1; when the switching device $SW_{1,1}$ is in an open state (turned off), the row port 1 is not electrically connected to the column port 1. The switching devices 46 ($SW_{i,j}$) can be implemented by the relay switches, and the controller 18 is configured to control the on/off state of the switching devices 46 ($SW_{i,j}$) according the changing instruction of the processor 28.

The test signal is generated by one of the sourcing or measurement units 12 in the testing system 10 and transmitted to the device under test 16 via the switching module 40 of the combinational switching matrix 30 and the probe card 14. The electrical signal of the device under test 16 is transmitted back to the sensor of the measurement units 12 via the probe card 14 and the switching module 40 of the combinational switching matrix 30, i.e., the switching module 40 is a bi-directional device. The row ports can serve as input ports of the switching module 40 to receive a signal, while the column ports can serve as output ports. The row ports can alternatively serve as output ports of the switching module 40, while the column ports can serve as input ports.

In response to the variation in the number of pins of the device under test 16, the user may directly elect to prepare individual switching matrixes having column and row ports corresponding to the device under test 16; however, this direct solution is not combinative since there is no integration interface in between switching matrixes. Another solution connects several existed switching modules in series or in parallel to form the combinational switching matrix 30 having corresponding column/row ports to the device under test 16. This solution is difficult to build and maintain since connecting the switching modules 40 in series or in parallel complicates the connections between the input ports and the output ports, which increase the workload of the user who must memorize the heavy and complicated interconnection between switching modules before correctly switching the channels between the input ports and the output ports. To help users work efficiently and reduce testing costs, the present invention provides a method for configuring the combinational switching matrix 30 by using the existed switching module such that the user does not need to memorize the complicated connections between the input ports and the output ports.

Figure 3:
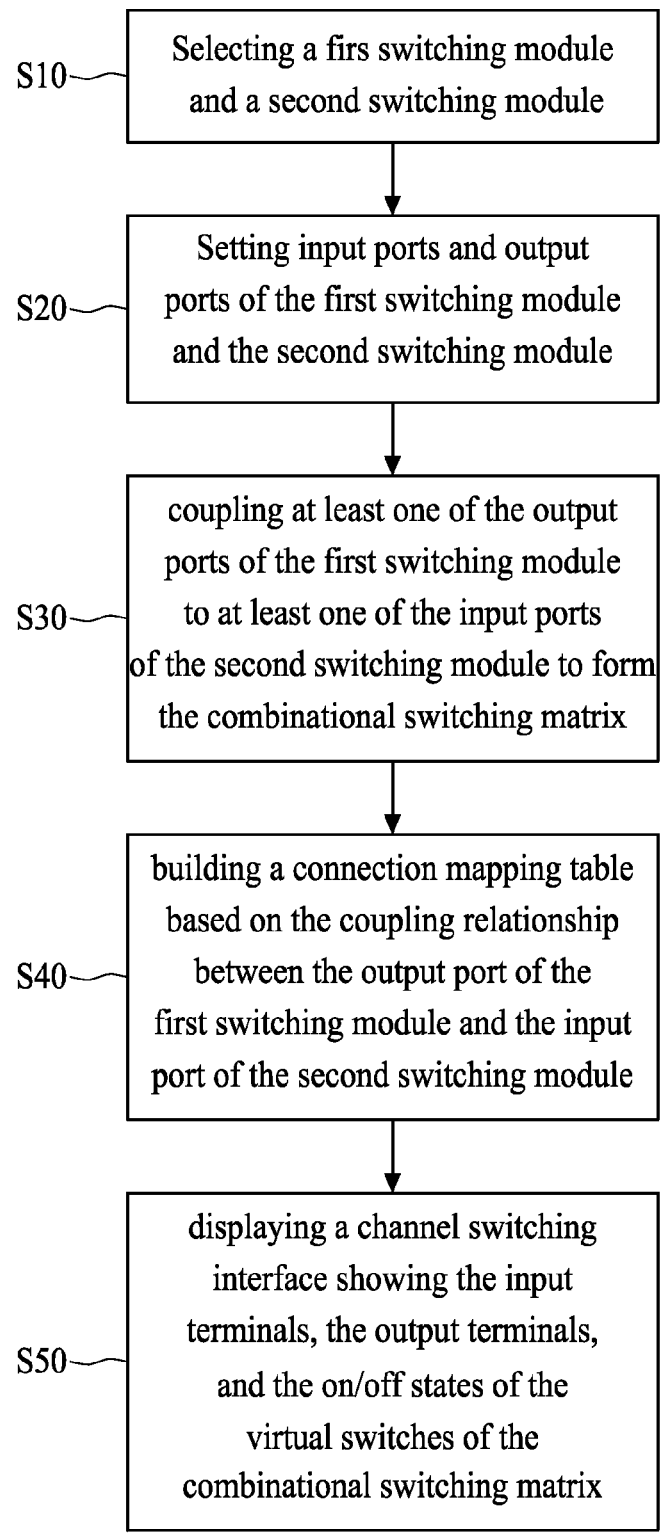
FIG. 3 illustrates a flowchart for configuring the combinational switching matrix according to one embodiment of the present invention.

FIG. 3 illustrates a flowchart for configuring the combinational switching matrix 30 according to one embodiment of the present invention. Configuring the combinational switching matrix 30 includes the steps of setting a first switching module and a second switching module (step S10), coupling at least one of the output ports of the first switching module with at least one of the input ports of the second switching module to form the combinational switching matrix (step S20), building a connection mapping table based on the coupling relationship between the output port of the first switching module and the input port of the second switching module (step S30), and displaying a channel switching interface showing the input terminals, the output terminals, and the on/off states of the virtual switching devices of the combinational switching matrix (step S40). The details of the above-mentioned steps are discussed in the following paragraphs.

Figure 4:
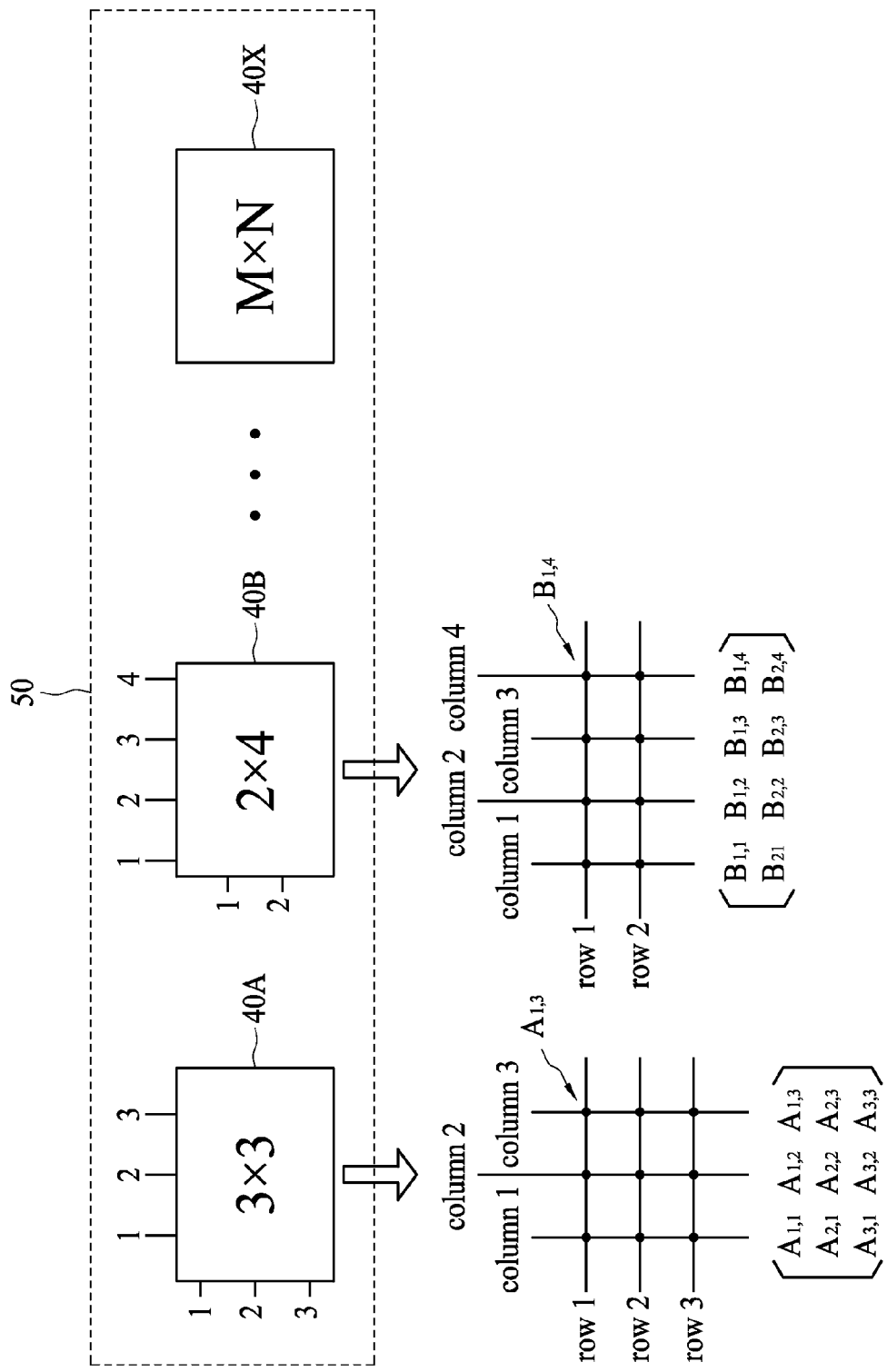
FIG. 4 to FIG. 8 illustrate a method for configuring the combinational switching matrix according to one embodiment of the present invention.

FIG. 4 to FIG. 8 illustrates a method for configuring the combinational switching matrix 30 according to one embodiment of the present invention. Referring to FIG. 4 and step S10 in FIG. 3, the display 22 shows a database 50 for selecting a first switching module 40A and a switching second module 40B. The database 50 with the switching module list is implemented by the memory 26 configured to store information of several switching modules 40A-40X, and the memory 26 may store information such as the model number, pin number, etc., as shown in FIG. 4. The first switching module 40A includes a plurality of first connection ports (three column ports and three row ports) and first switching devices ($A_{i,j}$), the second switching module 40B includes a plurality of second connection ports (four column ports and two row ports) and second switching devices ($B_{i,j}$).

Figure 5:
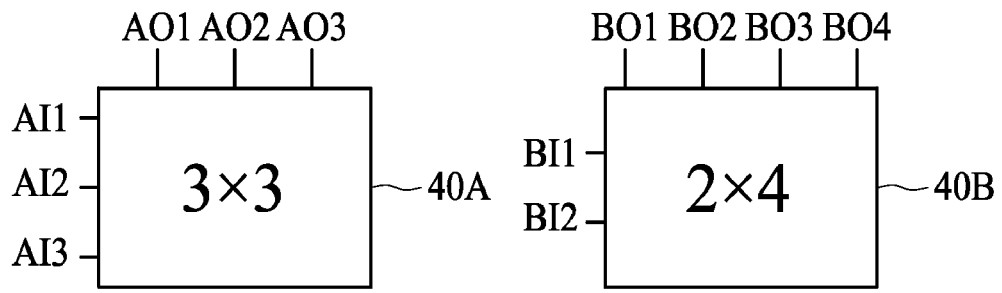

Referring to FIG. 5, an operator can use the input device 24, such as the mouse, keyboard or touch pen, to assign a portion of the first connection ports (three column ports) as first output ports AO1-AO3 and the remainder of the first connection ports (three row ports) as first input ports AI1-AI3. Similarly, the operator can assign a portion of the second connection ports (two row ports) as second input ports BI1-BI2 and the remainder of the second connection ports (four column ports) as second output ports BO1-BO4. As discussed in the previous paragraph, the column ports and the row ports of the first switching module 40A and the second switching module 40B are bi-directional, and the operator can optionally assign the three column ports as the input ports and the three row ports as the output ports of the first switching module 40A, and this optional assignment is also applicable to the second switching module 40B.

Figure 6:
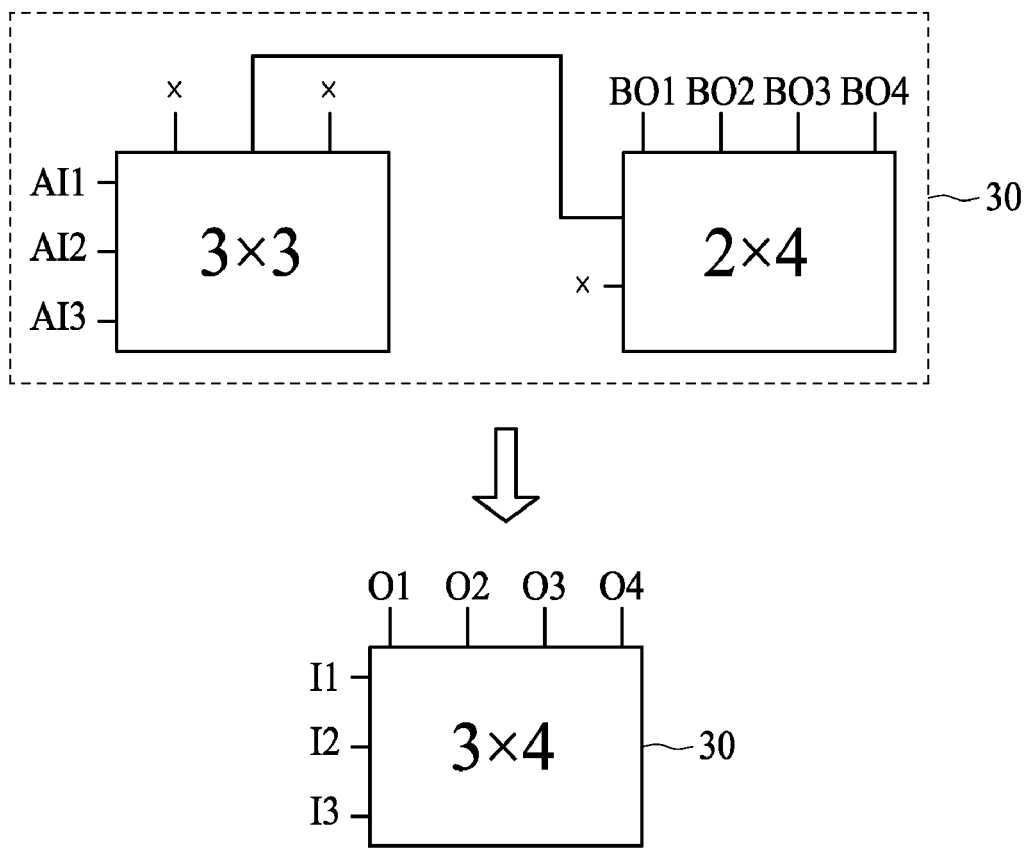

Referring to FIG. 6 and step S20 in FIG. 3, the operator uses the input device 24 to couple at least one port (AO2) of the first output ports (AO1-AO3) with at least one port (BI1) of the second input ports (BI1-BI2) to form the combinational switching matrix 30 including a plurality of input terminals I1-I3, output terminals O1-O4 and virtual switching devices $S_{i,j}$ representing the connection states between the input terminals I1-I3 and the output terminals O1-O4. In other words, combining the first switching module 40A and the second switching module 40B forms a combinational switching module with three input terminal I1-I3 and four output terminals O1-O4, without actual preparation of the additional 3×4 switching module.

In one embodiment of the present invention, coupling the first output port AO2 with the second input port BI1 can be performed by selecting the first output port AO2 as a first connection site, selecting the second input port BI1 as a second connection site, and connecting the first connection site and the second connection site to form a connection. In another embodiment of the present invention, coupling the first output port AO2 with the second input port BI1 can be performed by selecting the first output port AO2 as a first connection site, generating a line beginning at the first connection site, and dragging the line to the second input port BI1 as a second connection site to form a connection.

Figure 7:
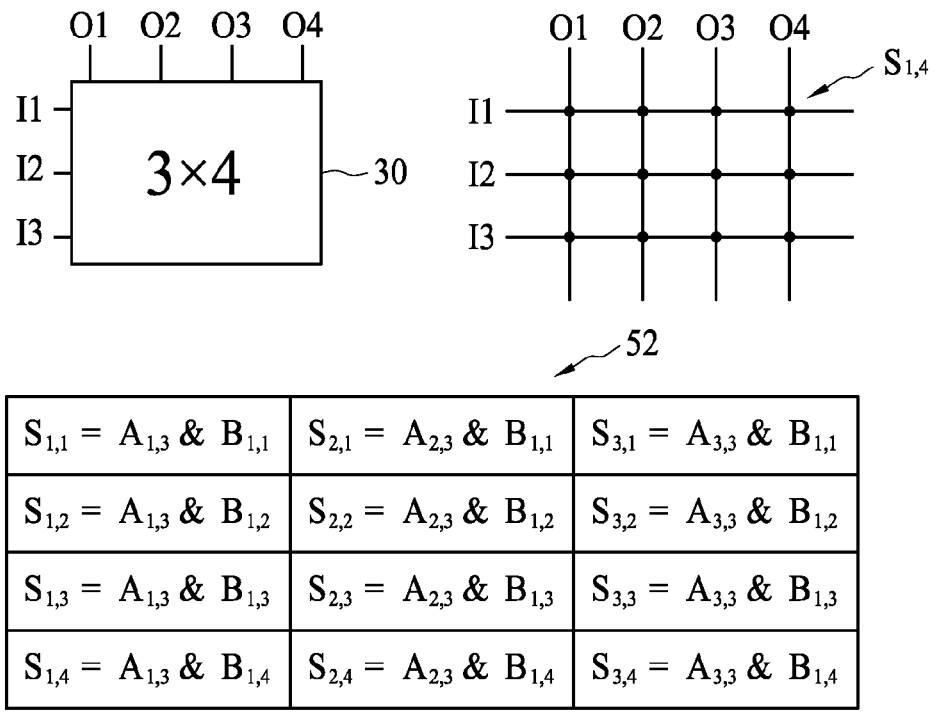

Referring to FIG. 7 and step S30 in FIG. 3, the processor 28 builds a connection mapping table 52 by considering the coupling relationship between the first output port AO2 and the second input port BI1. The virtual switching devices $S_{i,j}$ of the combinational switching matrix 30 represent the connection states between the input terminals I1-I3 and the output terminals O1-O4. The connection mapping table 52 is configured to record the relationship among the virtual switching devices $(S_{i,j})$ of the combinational switching matrix 30, the first switching devices $(A_{i,j})$ of the first switching module 40A and the second switching devices $(B_{i,j})$ of the second switching module 40B. In one embodiment of the present invention, the memory 26 is configured to store the connection mapping table 52 as well.

For example, to build a signal channel between the input terminal I1 and the output terminal O1 of the combinational switching matrix 30, the virtual switching devices $S_{1,1}$ must be in the closed state (turned on). In view of the coupling relationship between the first output port AO2 and the second input port BI1, the turning on of the virtual switching devices $S_{1,1}$ requires the turning on of both the first switching device $A_{1,1}$ and the second switching device $B_{1,1}$. In other words, the relationships between the virtual switching devices $(S_{i,j})$, the first switching devices $(A_{i,j})$ and the second switching devices $(B_{i,j})$ is logic "AND." Similarly, the relationships between the other virtual switching devices $(S_{i,j})$ the first switching devices $(A_{i,j})$ and the second switching devices $(B_{i,j})$ can be built in the same way to form the connection mapping table 52.

Figure 8:
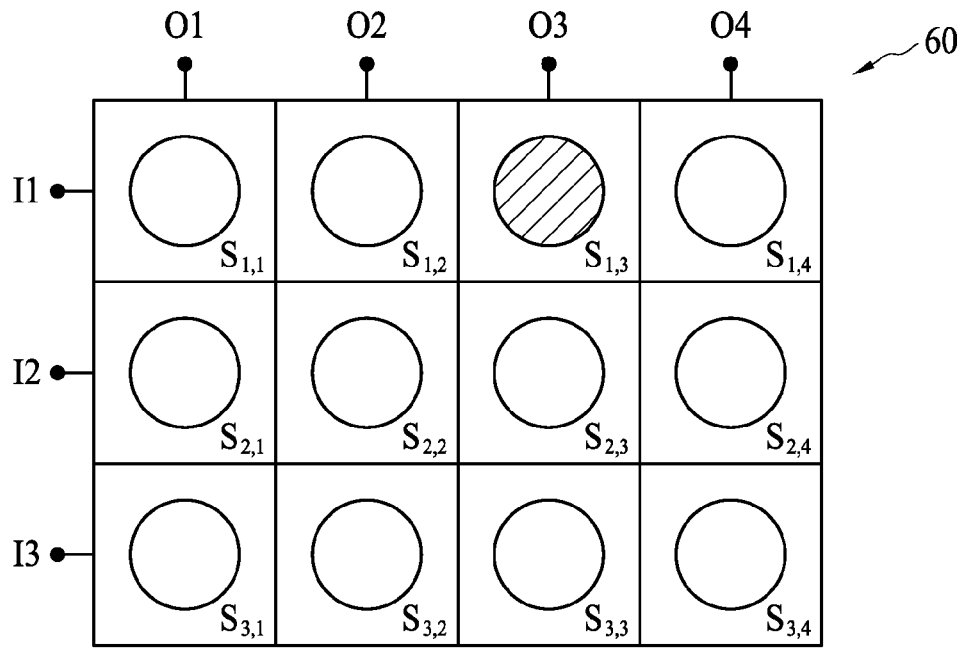

Referring to FIG. 8 and the step S40 in FIG. 3, the display 22 shows a channel switching interface 60 including the input terminals I1-I3, the output terminals O1-O4, and a plurality of objects representing the virtual switching devices $(S_{i,j})$. For example, a first object such as a first color or a first shape is used to represent the turned on (close state) of the virtual switching devices $(S_{i,j})$ and a second object such as a second color or a second shape is used to represent the turned off (open state) of the virtual switching devices $(S_{i,j})$. In one embodiment of the present invention, the solid circle is use to represent the turned on (close state) of the virtual switching device $(S_{1,3})$, and the hollow circle is used to represent the turned off (open state) of the virtual switching device $(S_{1,1})$.

The above-mentioned steps can be considered as a virtual rehearsal process on the operation system 20 for configuring the combinational switching matrix 30. If the rehearsal result meets the requirements (input terminals and output terminals) for testing the device under test 16, the operator can actually connect the first switching module 40A and the second switching module 40B, in accordance with the connection relationship shown in FIG. 6 to form the combinational switching matrix 30. After connecting the output terminals O1-O4 to the probe card 14 and connecting the input terminals I1-I3 to the measurement units 12, the combinational switching matrix 30 can switch the electrical signal channel between the device under test 16 and the source measure units 12. In addition, the operator can change the opening and closing of the virtual switching device $(S_{1,3})$ by using the input device 24.

In one embodiment of the present invention, the input device 24 is a touch pen and the display 22 is a touch screen showing the channel switching interface 60. The operator can use the touch pen 24 to directly press the object representing the desired virtual switching device $(S_{1,3})$ in the channel switching interface 60. The processor 28 generates a change instruction in view of the connection mapping table 52 and sends it to the controller 18, which then changes the on/off state of the first switching device $(A_{1,3})$ and the second switching device $(B_{1,3})$ corresponding to the desired virtual switching device $(S_{1,3})$. Correspondingly, the display 22 also changes the object from the solid circle to the hollow circle representing desired virtual switching device $(S_{1,3})$.

Without describing the complicated relationship among the virtual switching devices $(S_{i,j})$ of the combinational switching matrix 30, the first switching devices $(A_{i,j})$ of the first switching module 40A and the second switching devices $(B_{i,j})$ of the second switching module 40B, the operator can easily and correctly switch the electrical signal channel between the device under test 16 and the measurement units 12 simply by using the operation system 20 and the channel switching interface 60. Consequently, the present invention can dramatically reduce the workload of the operator on using the combinational switching matrix 30 that incorporates several switching modules in series or in parallel.

Figure 9:
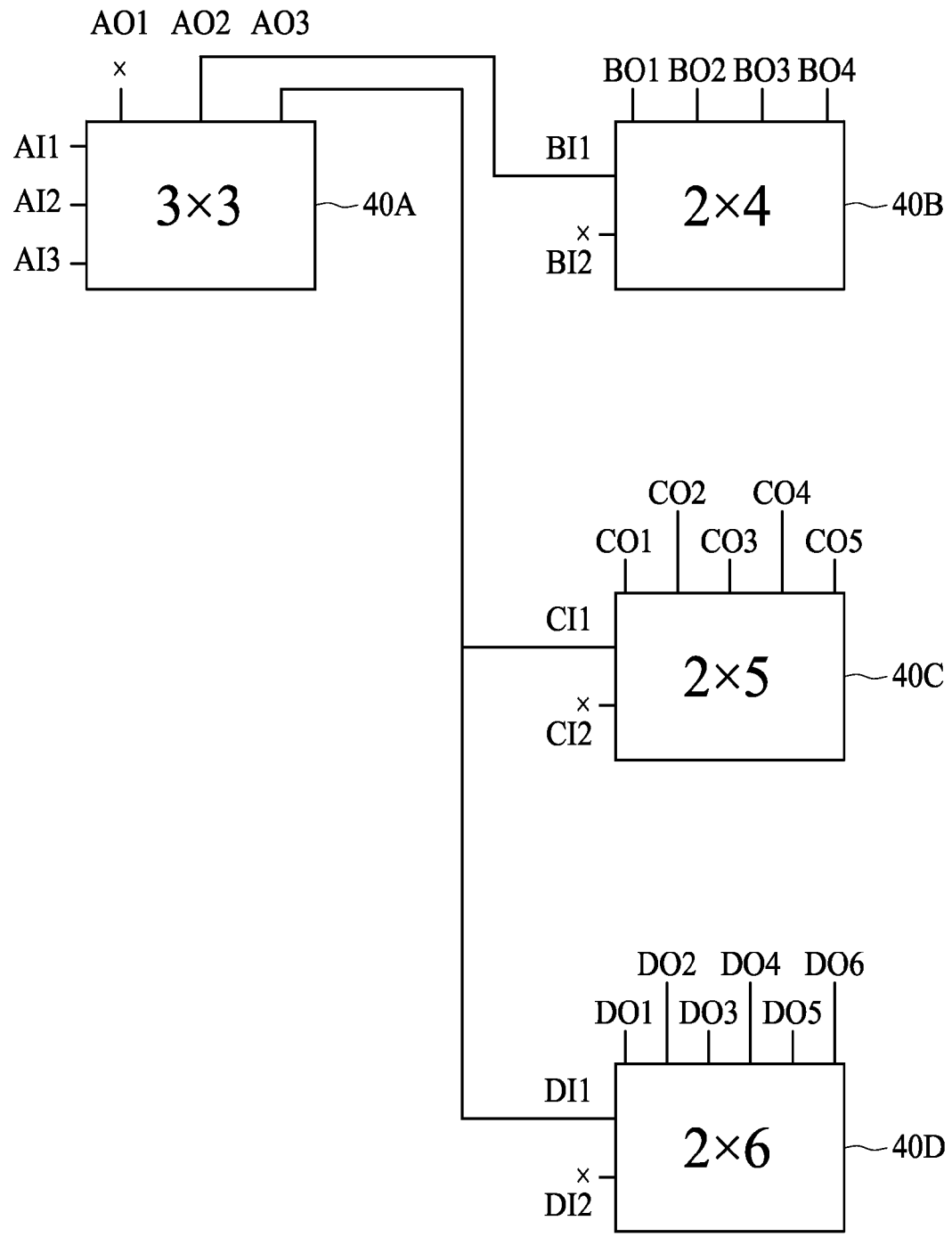
FIG. 9 and FIG. 10 illustrate a method for configuring the combinational switching matrix according to another embodiment of the present invention.
Figure 10:
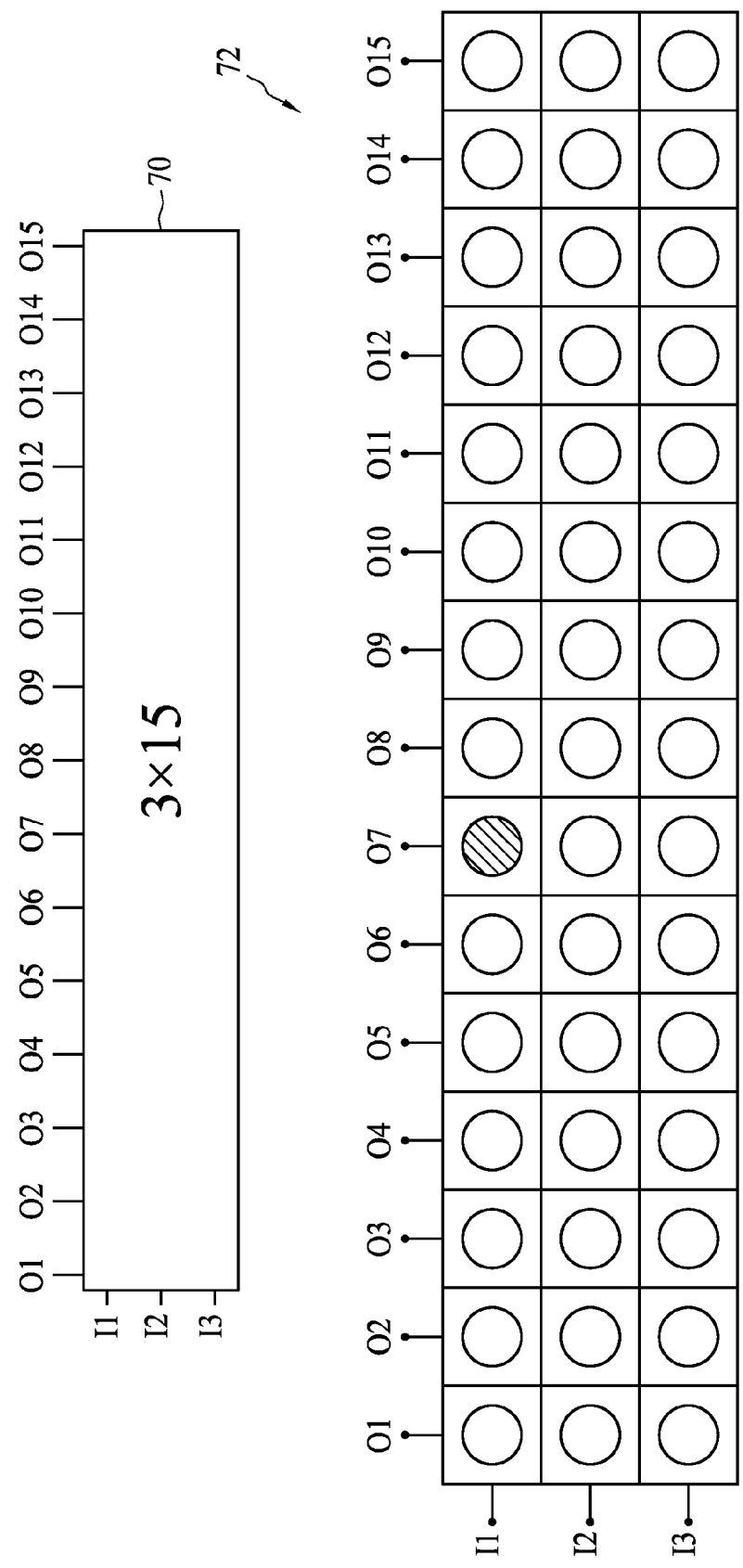

FIG. 9 and FIG. 10 illustrate a method for configuring a combinational switching matrix 70 according to another embodiment of the present invention. The method selects a first switching module 40A, a second switching module 40B, a third switching module 40C, and a fourth switching module 40D, and then sets the input ports (AI1-AI3, BI1-BI2, CI1-CI2, DI1-DI2) and output ports (AO1-AO3, BO1-BO4, CO1-CO5, DO1-DO6) of these switching modules 40A, 40B, 40C and 40D. Subsequently, the output port AO2 of the first switching module 40A is coupled with the input port BI1 of the second switching module 40B, the output port AO3 of the first switching module 40A is coupled with the input port CI1 of the third switching module 40C, the output port AO2 of the first switching module 40A is coupled with the input port DI1 of the fourth switching module 40D, so as to form the combinational switching matrix 70. A corresponding connection mapping table can then be built in a manner similar to that discussed in FIG. 7 by considering the above-mentioned coupling relationship. A channel switching interface 72 including the input terminals I1-I3, the output terminals O1-O15, and the virtual switching devices $(S_{i,j})$ can be shown to the operator, as shown in FIG. 10.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for configuring a combinational switching matrix, comprising the steps of:
    setting a first switching module and a second switching module such that the first switching module includes a plurality of first input ports, first output ports and first switching devices, and the second switching module includes a plurality of second input ports, second output ports and second switching devices, wherein the first switching devices are configured to open and close the electrical connection between the first input ports and the first output ports, and the second switching devices are configured to open and close the electrical connection between the second input ports and the second output ports;
    coupling at least one of the first output ports with at least one of the second input ports to form the combinational switching matrix including a plurality of input terminals, output terminals and virtual switching devices representing the connection states between the input terminals and the output terminals;
    building a connection mapping table by considering the coupling relationship between the first output ports and the second input ports, with the connection mapping table describing the relationship between the virtual switching devices, the first switching devices and the second switching devices; and
    displaying a channel switching interface including the input terminals, the output terminals and a plurality of virtual switching devices.

2. The method for configuring a combinational switching matrix of claim 1, wherein the step of setting a first switching module and a second switching module includes:
    selecting the first switching module including a plurality of first connection ports and the second switching module including a plurality of second connection ports;
    assigning a portion of the first connection ports as the first input ports and the remainder of the first connection ports as the first output ports; and
    assigning a portion of the second connection ports as the second input ports and the remainder of the second connection ports as the second output ports.

3. The method for configuring a combinational switching matrix of claim 2, further comprising a step of showing a database for selecting the first switching module and the second switching module on a display, wherein the database recodes information about the first switching module and the second switching module.

4. The method for configuring a combinational switching matrix of claim 1, wherein the step of coupling at least one of the first output ports with at least one of the second input ports is initiated by a mouse, a keyboard, or touch pen.

5. The method for configuring a combinational switching matrix of claim 1, wherein the step of coupling at least one of the first output ports with at least one of the second input ports includes:
    selecting one of the first output ports as a first connection site;
    selecting one of the second input ports as a second connection site; and
    connecting the first connection site and the second connection site.

6. The method for configuring a combinational switching matrix of claim 1, wherein the step of coupling at least one of the first output ports with at least one of the second input ports includes:
    selecting one of the first output ports as a first connection site;
    generating a line beginning at the first connection site; and
    drawing the line to one of the second input ports as a second connection site to form a connection.

7. The method for configuring a combinational switching matrix of claim 1, wherein the step of building a connection mapping table by considering the coupling relationship between the first output ports and the second input ports includes using the logic AND to associate the first switching devices with the second switching devices.

8. The method for configuring a combinational switching matrix of claim 1, wherein the step of displaying a channel switching interface includes using a first object to represent the open state of the virtual switching devices and a second object to represent the close state of the virtual switching devices.

9. The method for configuring a combinational switching matrix of claim 8, wherein the first object is a first color and the second object is a second color.

10. The method for configuring a combinational switching matrix of claim 8, wherein the first object is a first shape and the second object is a second shape.

11. The method for configuring a combinational switching matrix of claim 1, further comprising a step of changing the connection states of the virtual switching devices in response to an input instruction from a user.

12. The method for configuring a combinational switching matrix of claim 11, wherein the step of changing the connection states of the virtual switching devices in response to an input instruction from a user includes changing the connection states of the first switching devices and the second switching devices corresponding to the virtual switching devices in view of the connection mapping table.

13. The method for configuring a combinational switching matrix of claim 11, wherein the step of changing the connection states of the virtual switching devices includes using different objects to represent the virtual switching devices in the channel switching interface.

14. The method for configuring a combinational switching matrix of claim 1, wherein the channel switching interface is configured to show a plurality of objects in an array manner to represent the virtual switching devices.

15. The method for configuring a combinational switching matrix of claim 1, further comprising the steps of:
  connecting the output terminals to a probe card; and
  connecting the input terminals to a measurement unit.

16. A testing system for semiconductor devices, comprising:
  a combination switching matrix including a first switching module and a second switching module, the first switching module including a plurality of first input ports, first output ports and first switching devices, the second switching module including a plurality of second input ports, second output ports and second switching devices, the first switching devices being configured to open and close the electrical connection between the first input ports and the first output ports, the second switching devices being configured to open and close the electrical connection between the second input ports and the second output ports, and at least one of the first output ports being coupled with at least one of the second input ports;
  a processor configured to generate a changing instruction in response to an input instruction from a user;
  a controller configured to control the opening and closing of the first switching devices and the second switching devices in response to the changing instruction;
  wherein the combinational switching matrix includes:
  a plurality of input terminals corresponding to the first input ports;
  a plurality of output terminals corresponding to the second output ports;
  a plurality of virtual switching devices representing the connection states between the input terminals and the output terminals; and
  wherein the testing system for semiconductor devices further comprises a display configured to show a channel switching interface configured to show a plurality of objects representing the virtual switching devices.

17. The testing system for semiconductor devices of claim 16, wherein the channel switching interface is configured to show the objects representing the virtual switching devices in an array manner.

18. The testing system for semiconductor devices of claim 16, further comprising:
  a probe card connected to at least one of the output terminals; and
  a measurement unit connected to at least one of the input terminals.

19. The testing system for semiconductor devices of claim 18, further comprising a device under test connected to the probe card.

20. The testing system for semiconductor devices of claim 16, further comprising:
  an input device configured to receive the input instruction from the user; and
  a memory configured to store a connection mapping table including the relationship among the virtual switching devices, the first switching devices and the second switching devices.

21. The testing system for semiconductor devices of claim 20, wherein the input device is selected from the group consisting of a mouse, a keyboard, and a touch pen.

22. The testing system for semiconductor devices of claim 20, wherein the memory is configured to store the data of the first switching module and the second switching module.

* * * * *